(12) United States Patent
Bollesen

(10) Patent No.: US 6,617,685 B1
(45) Date of Patent: Sep. 9, 2003

(54) CLIP HEAT SINK ASSEMBLY

(75) Inventor: Vernon P. Bollesen, Milpitas, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 09/385,151

(22) Filed: Aug. 30, 1999

(51) Int. Cl.⁷ .................................................. H01L 23/34
(52) U.S. Cl. ...................... 257/719; 257/718; 257/727; 257/706
(58) Field of Search .................... 257/726, 727, 257/718, 706, 707, 722, 719

(56) References Cited

U.S. PATENT DOCUMENTS

| | | | |
|---|---|---|---|
| 3,757,406 A | 9/1973 | Bezar ........................ 29/203 H |
| 3,766,977 A | * 10/1973 | Pravada et al. |
| 3,964,148 A | 6/1976 | Sturtevant ................. 29/203 H |
| 4,054,901 A | * 10/1977 | Edwards et al. |
| 4,203,488 A | * 5/1980 | Johnson et al. |
| 4,261,192 A | * 4/1981 | Janian et al. |
| 4,388,967 A | * 6/1983 | Breese |
| 4,508,163 A | * 4/1985 | McCarthy |
| 4,605,058 A | * 8/1986 | Wilens |
| 4,794,780 A | 1/1989 | Battenfeld .................... 72/410 |
| 4,803,545 A | * 2/1989 | Birkle |
| 4,945,401 A | * 7/1990 | Trunk et al. |
| 4,970,779 A | 11/1990 | Chen ........................... 29/764 |
| 4,972,294 A | 11/1990 | Moses, Jr. et al. .......... 361/386 |
| 5,019,942 A | * 5/1991 | Clemens |
| 5,032,127 A | 7/1991 | Frazee et al. ................ 606/143 |
| 5,077,638 A | 12/1991 | Andersson et al. ......... 361/388 |
| 5,130,888 A | 7/1992 | Moore |
| 5,194,935 A | * 3/1993 | Kitano et al. |
| 5,208,731 A | 5/1993 | Blomquist ................... 361/386 |
| 5,214,825 A | * 6/1993 | Hirzel |
| D339,110 S | * 9/1993 | Steen, Jr. et al. |
| 5,253,702 A | 10/1993 | Davidson et al. ........... 165/80.4 |
| 5,276,585 A | 1/1994 | Smithers ..................... 361/704 |
| 5,287,823 A | * 2/1994 | Jiang |
| 5,307,239 A | 4/1994 | McCarty et al. ............. 361/704 |
| 5,309,181 A | * 5/1994 | Ota et al. |
| 5,329,426 A | 7/1994 | Villani ........................ 361/719 |
| 5,329,993 A | 7/1994 | Ettehadieh ............. 165/104.14 |
| 5,343,362 A | 8/1994 | Solberg ....................... 361/710 |
| 5,367,193 A | 11/1994 | Malladi ....................... 257/707 |
| 5,373,099 A | 12/1994 | Boitard et al. .............. 174/16.3 |
| 5,381,041 A | * 1/1995 | Harmon |
| 5,423,375 A | 6/1995 | Chiou ......................... 165/80.3 |
| 5,570,271 A | 10/1996 | Lavochkin .................. 361/704 |
| 5,586,005 A | 12/1996 | Cipolla et al. .............. 361/719 |
| 5,621,244 A | 4/1997 | Lin ............................. 257/713 |
| 5,650,913 A | * 7/1997 | Kochanski |
| 5,655,266 A | * 8/1997 | Gish |
| 5,699,229 A | 12/1997 | Brownell .................... 361/719 |
| 5,748,446 A | 5/1998 | Feightner et al. ........... 361/709 |
| 5,761,041 A | 6/1998 | Hassanzadeh et al. ...... 361/704 |
| 5,847,928 A | 12/1998 | Hinshaw et al. ............ 361/704 |
| 5,881,800 A | 3/1999 | Chung ........................ 165/80.3 |
| 5,884,692 A | 3/1999 | Lee et al. .................... 165/80.3 |
| 5,930,114 A | * 7/1999 | Kuzmin et al. |
| 5,959,350 A | 9/1999 | Lee et al. ..................... 257/712 |
| 5,983,489 A | 11/1999 | Jee .............................. 29/751 |
| 5,991,151 A | 11/1999 | Capriz ........................ 361/704 |
| 5,991,154 A | * 11/1999 | Clemens et al. |
| 6,023,833 A | 2/2000 | Jacobsmeier ................. 29/450 |
| 6,062,301 A | * 5/2000 | Lu |
| 6,188,577 B1 | * 2/2001 | Liu |
| 6,208,518 B1 | * 3/2001 | Lee |

\* cited by examiner

*Primary Examiner*—Sheila V. Clark
(74) *Attorney, Agent, or Firm*—Gunnison, McKay & Hodgson, L.L.P.; Serge J. Hodgson (57) ABSTRACT

A heat sink assembly includes a retainer having a body, a finger extending from the body and legs extending from the body. The assembly further includes a heat sink having a base and fins extending from the base, where slits in the fins define a trench. A package which includes an electronic device is located between a circuit board and the heat sink and the retainer holds the heat sink in place. To secure the heat sink with the retainer, the retainer is positioned so that the finger of the retainer is aligned with the trench of the heat sink and the legs of the retainer are aligned to slide around the circuit board. The retainer is then moved to slide the finger into the trench and the legs around the circuit board.

15 Claims, 10 Drawing Sheets

CLIP HEAT SINK ASSEMBLY

FIELD OF THE INVENTION

The present invention relates generally to the packaging of electronic components in electronic devices. More particularly, the present invention relates to the removable attachment of a heat sink to an integrated circuit package mounted on a circuit board in an electronic device.

BACKGROUND OF THE INVENTION

As the art moves towards smaller higher power integrated circuits such as SRAMs, heat transfer from the integrated circuit package (IC package) becomes increasingly difficult and more important. As used herein, the term "IC package" includes the heat generating integrated circuit as well as the packaging surrounding the integrated circuit.

One conventional technique to remove heat from an IC package is to employ a finned heat sink which is placed in thermal contact with the IC package. In this manner, heat generated by the IC package is conducted to the heat sink and then dissipated to the ambient environment.

Of importance, the heat sink must be reliably attached to the IC package in a manner which does not undesirably stress or damage the IC package or the circuit board to which the IC package is connected. One conventional technique is to employ a thermally conductive adhesive which bonds the heat sink to the IC package. However, thermally conductive adhesives do not adhere well to plastic IC packages resulting in an unacceptably high incidence of bond failure between the plastic IC package and the heat sink. Further, once the heat sink is bonded with the thermally conductive adhesive, it is difficult to remove the heat sink from the IC package without causing damage to the IC package, the heat sink or the circuit board. Yet, it is desirable to have a removable heat sink to readily allow chip repair, rework and/or replacement. Accordingly, it is desirable to avoid the use of thermally conductive adhesives altogether.

One prior art removable heat sink uses clips and/or fasteners to attach the heat sink directly to the IC package. However, when attached in this manner, the heat sink exerts undue force on the IC package which can damage and ultimately destroy the IC package. To avoid this problem, other removable heat sinks are attached directly to the circuit board to which the IC package is connected.

Figure 1:
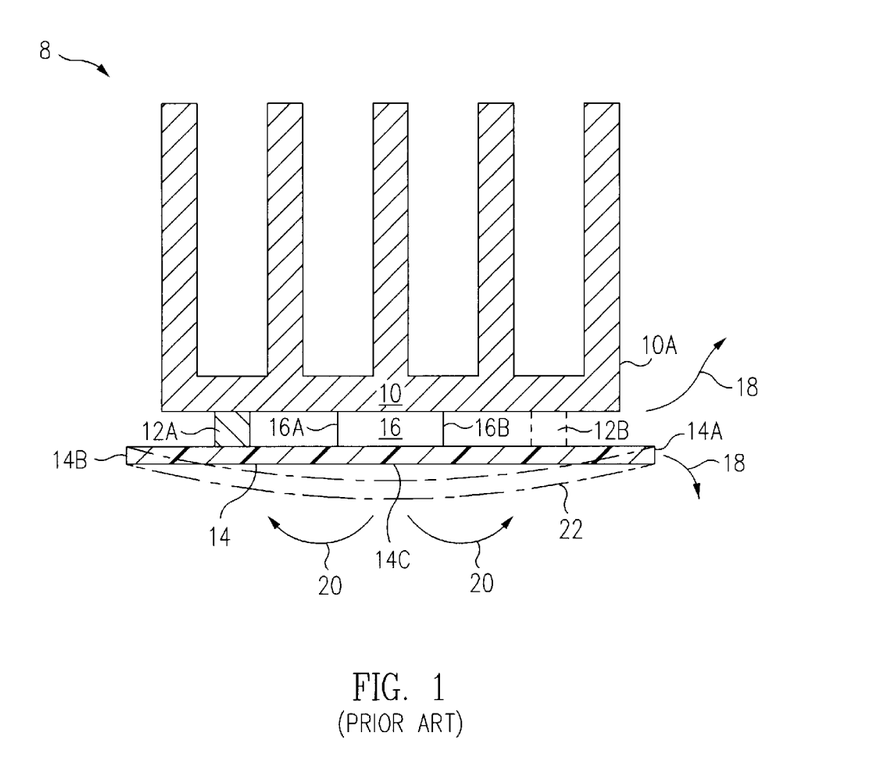
FIG. 1 is a side view of an electronic device which includes a heat sink directly attached by post type fastening members to a circuit board in accordance with the prior art.

FIG. 1 is a side view of an electronic device 8 which includes a heat sink 10 directly attached by post type fastening members 12A to a circuit board 14 in accordance with the prior art. Located between heat sink 10 and circuit board 14 is an IC package 16 which generates heat during use. IC package 16 is typically electrically connected to circuit board 14 by one or more circuit interconnections, e.g., solder, which are not illustrated in FIG. 1 for purposes of clarity. Fastening members 12A urge heat sink 10 towards circuit board 14 and down onto IC package 16 to make the thermal contact between heat sink 10 and IC package 16.

Although providing the force necessary to make the thermal contact between heat sink 10 and IC package 16, fastening members 12A cause heat sink 10 to press unevenly on IC package 16. In particular, IC package 16 acts as a pivot between heat sink 10 and circuit board 14 so that end 10A of heat sink 10 is urged away from end 14A of circuit board 14 as indicated by arrows 18. This causes the force exerted by heat sink 10 on to IC package 16 to be greater at side 16A of IC package 16 than at side 16B. This uneven force distribution can damage and even crack IC package 16. Further, this uneven force distribution can create a gap between side 16B and heat sink 10 resulting in poor heat transfer between IC package 16 and heat sink 10. Alternatively, or in addition to, this uneven force distribution can cause circuit interconnection failure near side 16B of IC package 16. As those skilled in the art understand, these conditions can ultimately cause failure of device 8.

To avoid these drawbacks, it has become known in the art to attach both sides of heat sink 10 to circuit board 14. As an example, second post type fastening members 12B illustrated in dashed lines in FIG. 1 can be employed. This tends to equalize the force exerted by heat sink 10 on both sides 16A and 16B of IC package 16. However, this also causes the ends 14A, 14B of circuit board 14 to be pulled up by fastening members 12B, 12A, respectively, relative to the die attach region 14C of circuit board 14 to which IC package 16 is attached. This bending force, indicated by arrows 20, causes warpage of circuit board 14 such that circuit board 14 is displaced to a position 22. Over time, this warpage can cause device 8 to fail, e.g., from failure of circuit interconnections between IC package 16 and circuit board 14.

Accordingly, the art needs a heat sink assembly which results in even force application to the IC package and avoids circuit board warpage.

SUMMARY OF THE INVENTION

In accordance with the present invention, a heat sink assembly for an electronic device is presented. The assembly includes a retainer having a body with a first body edge and a second body edge, the second body edge being opposite and removed from the first body edge, a finger extending from the body along the first body edge and at least one leg extending from the body along the second body edge. The assembly further includes a heat sink having a base and fins extending from the base, where slits in the fins define a trench. In the finished assembly, an upper package which includes an electronic device is located between a substrate such as a circuit board and the heat sink, and the retainer holds the heat sink in place.

When attached to the heat sink, tension in the retainer causes the finger to apply a downward vertical force on the heat sink. The heat sink, in turn, presses downwards towards the upper package. Of importance, by locating a finger tip of the finger at the center of the heat sink, the heat sink presses down uniformly on the upper package.

In one embodiment, the upper package is attached to an upper surface of the circuit board, and a lower package which includes an electronic device is attached to a lower surface of the circuit board directly opposite the upper package. In accordance with this embodiment, the retainer includes two legs which are symmetric with respect to the finger, and each leg applies an equal upward force on the lower package. In this manner, a heat sink assembly in accordance with the present invention avoids the application of uneven force distribution on the upper and lower packages and the associated damage and ultimate device failure caused by use of conventional heat sink assemblies.

Further, the vertical upward force is transferred from the legs directly back to the heat sink through the lower package, the circuit board and the upper package without imparting any bending force on the circuit board. In this manner, a heat sink assembly in accordance with the present invention avoids circuit board warpage and the associated ultimate device failure associated with conventional heat sink assemblies.

In one embodiment, the body of the retainer is adjacent an edge of the circuit board so that the retainer passes around the circuit board instead of through the circuit board. The allows greater utilization of the circuit board, e.g., allows more traces and/or vias to be located on or in the circuit board, compared to the case where a retainer passes through the circuit board.

Also in accordance with the present invention, a method of assembling a heat sink assembly includes locating an upper package having an electronic device between a substrate such as a circuit board and a heat sink. A retainer is then positioned so that a finger of the retainer is aligned with a trench of the heat sink. The finger is then slid into the trench to secure the heat sink in place with the retainer.

While aligning the finger of the retainer with the trench of the heat sink, legs of the retainer are also aligned to slide around the circuit board. Thus, when the finger is slid into the trench, the legs also slide around the circuit board. Typically, the legs slide on a lower package attached to a lower surface of the circuit board, the lower package including an electronic device.

In some applications, installation of the retainer by the method described above may damage the assembly. For example, sliding of the legs along the lower package can damage the lower package or cause circuit interconnection failure between the lower package and the circuit board. To avoid potential damage to the assembly, the finger is spread apart from the legs. The retainer is then positioned without sliding of the retainer on the heat sink or on the lower package. The finger is then released thus securing the retainer to the heat sink.

In accordance with the present invention, a clip assembly tool for grasping the finger and legs of the retainer and spreading them apart from one another is presented. The tool includes a lower arm having a first clasp and an upper arm having a second clasp. The lower arm is pivotally attached to the upper arm. The tool further includes a wedge arm having a nose, where the wedge arm is pivotally attached to the upper arm.

A method of using the tool includes inserting the retainer between the first clasp and the second clasp, where the first and second clasps include first and second catches, respectively. The lower arm includes a first handle and the upper arm includes a second handle. The second handle is moved towards the first handle which causes the second clasp to move away from the first clasp allowing the retainer to be inserted between the first clasp and the second clasp. After the retainer is inserted, the second clasp is moved back towards the first clasp by moving the second handle away from the first handle.

The retainer is then wedged into the first catch and the second catch. To wedge the retainer, a third handle of the wedge arm is moved towards the second handle of the upper arm. This causes the nose of the wedge arm to press against the retainer and wedge the legs and finger of the retainer into the first and second catchs, respectively.

Once securely wedged, the retainer prevents the third handle of the wedge arm from being moved closer to the second handle of the upper arm. Thus, further motion of the third handle towards the first handle of the lower arm produces an equal downward motion of the second handle of the upper arm. As a result, the second clasp again moves away from the first clasp. Since the legs and the finger are securely fastened to the first and second catches, respectively, the finger is spread from the legs.

The finger is then inserted into the trench of the heat sink and the legs are positioned below the circuit board and the lower package attached to the lower surface of the circuit board. The tool is then operated by reversing the above described procedure to release the finger and to secure the retainer to the heat sink.

Of importance, the retainer is positioned and secured without sliding the finger along the heat sink and without sliding the legs along the lower package. Thus, use of the tool in accordance with the present invention avoids the possibility of damaging the heat sink assembly during installation of the retainer.

These and other features and advantages of the present invention will be more readily apparent from the detailed description set forth below taken in conjunction with the accompanying drawings.

BRIEF DESCRIPTION OF THE DRAWINGS

In the following description, similar elements are labeled with similar reference numbers.

DETAILED DESCRIPTION

This application is related to Bollesen, co-filed U.S. patent application Ser. No. 09/385,158, now U.S. Pat. No. 6,219,905, issued Apr. 24, 2001, herein incorporated by reference in its entirety.

In accordance with the present invention, a heat sink assembly 100 (FIG. 2) for an electronic device is presented. The assembly includes a retainer 118 having a body 126 with an upper (e.g., first) body edge 121U and a lower (e.g., second) body edge 121L, lower body edge 121L being opposite and removed from upper body edge 121U. A finger 120 extends from body 126 along upper body edge 121U and at least one leg 124 extends from body 126 along lower body edge 121L. Assembly 100 further includes a heat sink 112 having a base 115 and fins 114 extending from base 115, where slits 136 (FIG. 7) in fins 114 define a trench 138. Referring again to FIG. 2, IC packages 104 which include electronic devices are located between a substrate 102, such as a circuit board, and heat sink 112. Retainer 118 holds heat sink 112 in place. A thermal pad 116 is located between heat sink 112 and IC packages 104.

Figure 2:
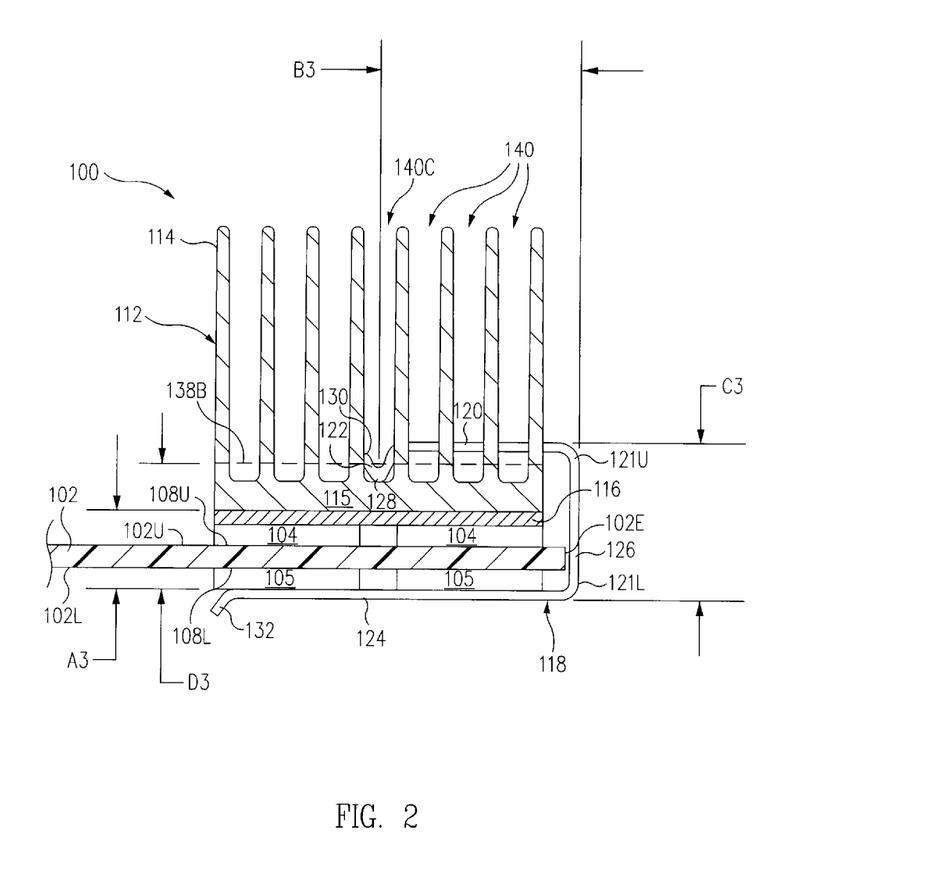
FIG. 2 is a side view of an electronic device employing a heat sink assembly in accordance with the present invention.

When attached to heat sink 112, tension in retainer 118 causes finger 120 to apply downward vertical force on heat sink 112. Heat sink 112, in turn, presses downwards towards IC packages 104. Of importance, by locating a finger tip 122 of finger 120 at the center of heat sink 112, heat sink 112 presses down uniformly on IC packages 104.

IC packages 104 are attached to an upper surface 102U of substrate 102, and IC packages 105 which include electronic devices are attached to a lower surface 102L of substrate 102 directly opposite IC packages 104. In accordance with this embodiment, retainer 118 includes two legs 124 which are symmetric with respect to finger 120, and each leg 124 applies an equal upward force on IC packages 105. In this manner, a heat sink assembly in accordance with the present invention avoids the application of uneven force distribution on IC packages 104, 105 and the associated damage and ultimate device failure caused by use of conventional heat sink assemblies.

Further, the vertical upward force is transferred from legs 124 directly back to heat sink 112 through IC packages 105, substrate 102, IC packages 104 and thermal pad 116 without imparting any bending force or torque on substrate 102. In this manner, a heat sink assembly in accordance with the present invention avoids substrate (e.g., circuit board) warpage and the ultimate device failure associated with conventional heat sink assemblies.

In one embodiment, body 126 of retainer 118 is adjacent an edge 102E of substrate 102 so that retainer 118 passes around substrate 102 instead of through substrate 102. The allows greater utilization of substrate 102, e.g., allows more traces and/or vias to be located on or in substrate 102, compared to the case where a retainer passes through substrate 102.

Figure 7:
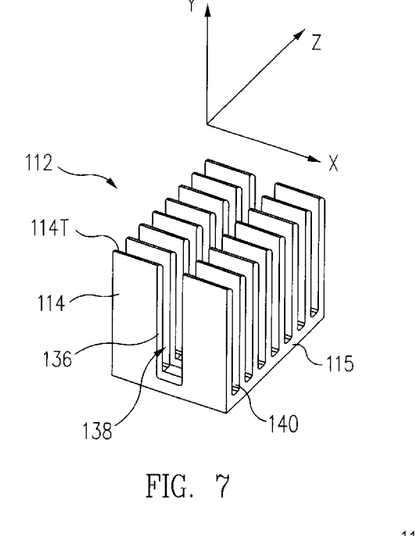
FIG. 7 is a perspective view of a heat sink in accordance with the present invention.

Also in accordance with the present invention, a method of assembling a heat sink assembly includes locating IC packages 104 between substrate 102 and heat sink 112. Retainer 118 is then positioned so that finger 120 of retainer 118 is aligned with trench 138 of heat sink 112. Finger 120 is then slid into trench 138 to secure heat sink 112 in place with retainer 118.

While aligning finger 120 of retainer 118 with trench 138 of heat sink 112, legs 124 of retainer 118 are also aligned to slide around substrate 102. Thus, when finger 120 is slid into trench 138, legs 124 also slide around substrate 102. Typically, legs 124 slide on IC packages 105.

In some applications, installation of retainer 118 by the method described above may damage the assembly. For example, sliding of legs 124 along IC packages 105 can damage IC packages 105 or cause circuit interconnection failure between IC packages 105 and substrate 102. To avoid potential damage to the assembly, finger 120 is spread apart from legs 124. Retainer 118 is then positioned without sliding of retainer 118 on heat sink 112 or on IC packages 105. Finger 120 is then released thus securing retainer 118 to heat sink 112.

In accordance with the present invention, a clip assembly tool 200 (FIG. 10) for grasping finger 120 and legs 124 of retainer 118 and spreading them apart from one another is presented. Tool 200 includes a lower arm 210 having a first clasp 204 and an upper arm 206 having a second clasp 202. Lower arm 210 is pivotally attached to upper arm 206. Tool 200 further includes a wedge arm 216 having a nose 220, where wedge arm 216 is pivotally attached to upper arm 206.

Figure 11:
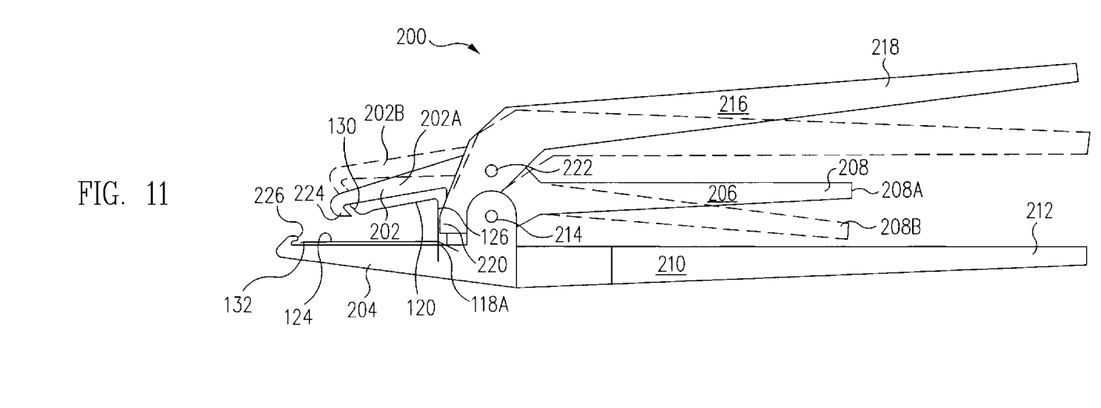
FIG. 11 is a side plan view of a retainer being placed in clasps of the tool of FIG. 10.

Referring now to FIG. 11, a method of using tool 200 includes inserting a retainer 118 A between first clasp 204 and second clasp 202, where first and second clasps 204, 202 include first and second catches 226, 224, respectively. Lower arm 210 includes a first handle 212 and upper arm 206 includes a second handle 208. Second handle 208 is moved towards first handle 212 which causes second clasp 202 to move away from first clasp 204 allowing retainer 118A to be inserted between first clasp 204 and second clasp 202. After retainer 118A is inserted, second clasp 202 is moved back towards first clasp 204 by moving second handle 208 away from first handle 212.

Figure 12:
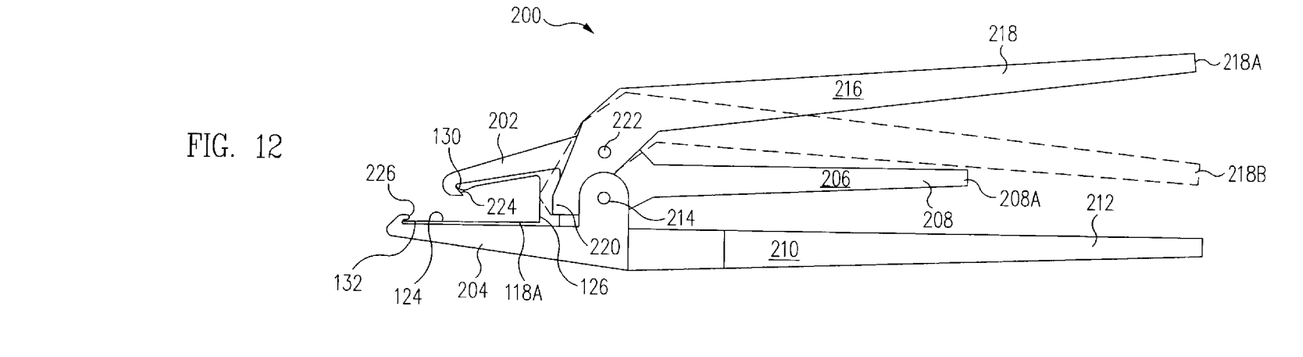
FIG. 12 is a side plan view of the retainer being secured in the clasps of the tool of FIG. 10.

Referring to FIG. 12, retainer 118A is then wedged into first catch 226 and second catch 224. To wedge retainer 118A, a third handle 218 of wedge arm 216 is moved towards second handle 208 of upper arm 206. This causes nose 220 of wedge arm 206 to press against retainer 118A and wedge legs 124 and finger 120 of retainer 118A into first and second catchs 226, 224, respectively.

Figure 13:
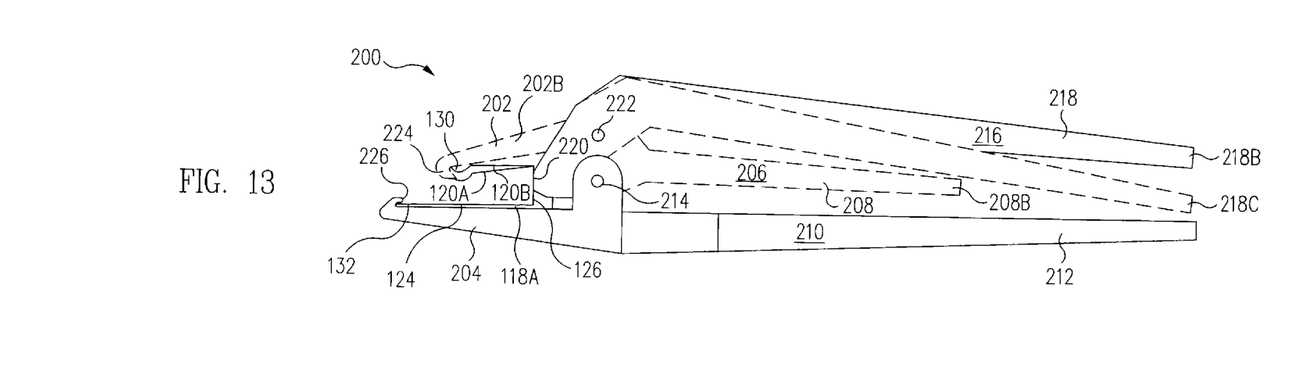
FIG. 13 is a side plan view of the retainer being spread by the tool of FIG. 10.

Referring now to FIG. 13, once securely wedged, retainer 118A prevents third handle 218 of wedge arm 216 from being moved closer to second handle 208 of upper arm 206. Thus, further motion of third handle 218 towards first handle 212 of lower arm 210 produces an equal downward motion of second handle 208 of upper arm 206. As a result, second clasp 202 again moves away from first clasp 204. Since legs 124 and finger 120 are securely fastened to first and second catches 204, 202, respectively, finger 120 is spread from legs 124.

Referring to FIG. 2, finger 120 is then inserted into trench 138 of heat sink 112 and legs 124 are positioned below substrate 102 and IC packages 105. Tool 200 is then operated by reversing the above described procedure to release finger 120 and to secure the retainer to heat sink 112.

Of importance, the retainer is positioned and secured without sliding finger 120 along heat sink 112 and without sliding legs 124 along IC packages 105. Thus, use of tool 200 in accordance with the present invention avoids the possibility of damaging the heat sink assembly during installation of the retainer.

More particularly, FIG. 2 is a side view of device 100 employing a heat sink assembly in accordance with the present invention. Device 100 includes substrate 102 such as a printed circuit board (hereinafter referred to as circuit board 102). Attached to upper surface 102U, e.g., a first surface, of circuit board 102 are IC packages 104 which include heat generating electronic components such as integrated circuits. Also attached to lower surface 102L, e.g., a second surface opposite and removed from the first surface, of circuit board 102 are two IC packages 105 which include heat generating electronic components such as integrated circuits. IC packages 104, 105 may be the same type of IC package, for example, SRAMs.

As shown in FIG. 2, IC packages 104 are attached to an upper die attach area 108U of upper surface 102U of circuit board 102. Similarly, IC packages 105 are attached to a lower die attach area 108L of lower surface 102L of circuit board 102. Generally, die attach areas 108U, 108L include the circuit board areas to which IC packages 104, 105 are attached and also the immediate circuit board area around IC packages 104, 105 including the circuit board area between IC packages 104, 105, respectively. IC packages 104, 105 are attached typically by one or more circuit interconnections such as solder, solder balls, pins, or by adhesive.

Although two IC packages 104 and two IC packages 105 are illustrated in FIG. 2, for a total of four packages, a different number of packages can be used, e.g., one, two, four or more.

In thermal contact with IC packages 104 is heat sink 112 having a base 115 and fins 114 extending from base 115. Heat sink 112 is made of a material having a high thermal conductivity, e.g., is made of a metal such as aluminum or copper. Although fins 114 are illustrated in FIG. 2, other heat sink designs can also be used, e.g., solid heat sinks, plate type heat sinks, tower type heat sinks, pipe type heat sinks and disk shaped heat sinks.

Typically, a thermal pad 116 such as an elastomer having a thermally conductive filler, e.g., aluminum oxide and/or boron nitride, is interposed between heat sink 112 and IC packages 104 although other materials such as thermally conductive grease can be used. Illustratively, thermal pad 116 is 0.040 inches thick. In one embodiment, thermal pad 116 is compliant thus compensating for any mismatch in physical characteristics and thermal expansion between heat sink 112 and IC packages 104. Further, in one embodiment, thermal pad 116 has a high thermal conductivity thus improving heat transfer between IC packages 104 and heat sink 112. However, in an alternative embodiment, thermal pad 116 is not used and heat sink 112 directly contacts IC packages 104.

Heat sink 112 is held in place and pressed into thermal contact with IC packages 104 by retainer 118. In this embodiment, retainer 118 is a clip having finger 120, where finger 120 includes finger tip 122 which presses downwards (e.g., in a first direction) on base 115 and holds heat sink 112 in place. Retainer 118 further has legs 124 which press upwards (e.g., in a second direction opposite the first direction) on IC packages 105. Finger 120 and legs 124 are integrally connected to and extend from body 126 of retainer 118. Retainer 118 passes around edge 102E of circuit board 102 such that body 126 of retainer 118 is located adjacent edge 102E.

In FIG. 2, legs 124 directly contact IC packages 105. However, a protective pad (not shown) can be located between legs 124 and IC packages 105, for example an electrically insulative pad can be located between legs 124 and IC packages 105. As a further alternative, device 100 can be fabricated without IC packages 105. In this embodiment, legs 124 directly contact and press on lower surface 102L of circuit board 102 or on a protective pad located between legs 124 and lower surface 102L of circuit board 102.

Illustrative specifications for the various characteristics shown in FIG. 2 are set forth below in Table 1.

TABLE 1

| Characteristic | Specification | Units |
|---|---|---|
| A3 | 0.265 | Inches |
| B3 | 0.770 | Inches |
| C3 | 0.54 | Inches |
| D3 | 0.415 | inches |

Figure 3:
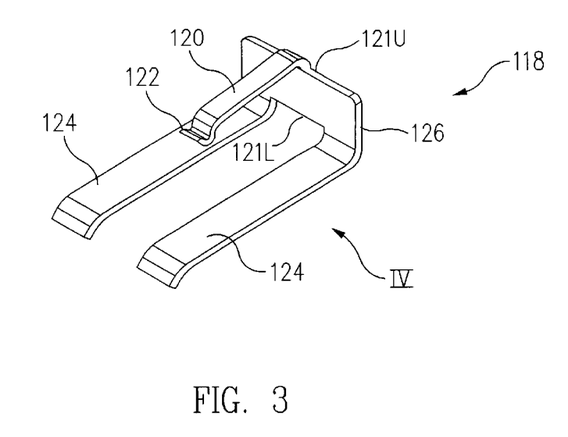
FIG. 3 is a perspective view of a heat sink retainer in accordance with the present invention.

FIG. 3 is a perspective view of retainer 118 of FIG. 2. As shown in FIG. 3, finger 120 is integrally attached to a first body edge 121U of body 126 and legs 124 are integrally attached to a second body edge 121L of body 126, where body edge 121L is opposite and removed from body edge 121U. Retainer 118 includes two legs 124 and a single finger 120. However, in alternative embodiments, a different number of fingers 120 and/or legs 124 can be used. Generally, retainer 118 includes at least one finger 120 and at least one leg 124. In the case where more than one finger 120 is used, heat sink 112 is modified to accommodate the additional fingers 120.

Retainer 118 is made of a flexible resilient material having a high spring rate. Thus retainer 118 has the ability to return to its original form, i.e., relaxed state, after being forced out of shape. For example, retainer 118 is full hard type 302 stainless steel or, more generally, is steel although other materials such as beryllium copper can be used. Retainer 118 is typically, integral, i.e., is a single piece, and is manufactured using well known techniques such as by stamping and bending a single sheet of metal, composites, plastic derivatives, etc.

Figure 4:
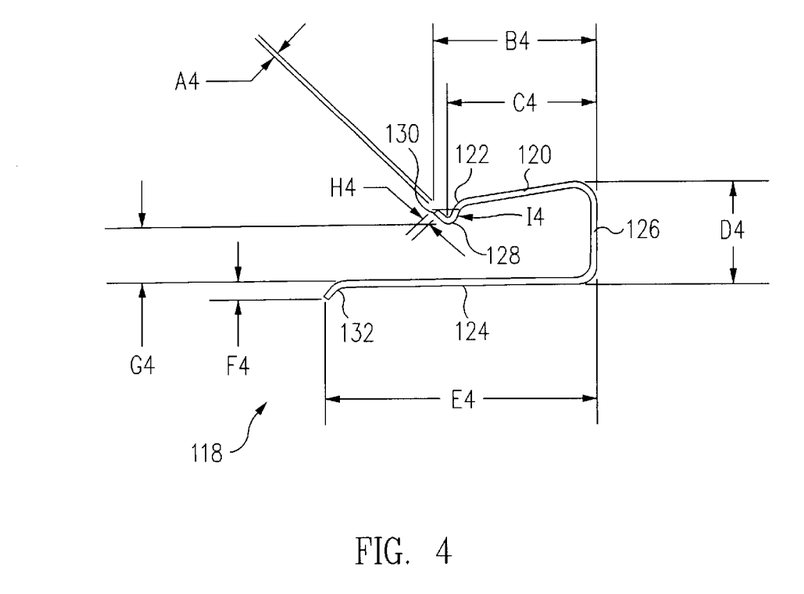
FIG. 4 is a side plan view of the retainer taken from the line IV of FIG. 3.

FIG. 4 is a side plan view of retainer 118 taken from the line IV of FIG. 3. As shown in FIG. 4, finger tip 122 curves downwards (towards legs 124) from the main length of finger 120 to an apex 128. From apex 128, finger tip 122 curves upwards (away from legs 124) to an angled end 130 which extends at an angle away from legs 124. Further, legs 124 include angled ends 132 which extend at an angle away from finger 120. Angled ends 130, 132 allow retainer 118 to be slid into place. Alternatively, angled ends 130, 132 are gripping features which enable a clip assembly tool to grasp retainer 118 as discussed in detail below.

Illustrative specifications for the various characteristics shown in FIG. 4 are set forth below in Table 2.

TABLE 2

| Characteristic | Specification | Units |
|---|---|---|
| A4 | 0.032 (0.032*) | Inches |
| B4 | 0.85 (0.96) | Inches |
| C4 | 0.77 (0.77) | Inches |
| D4 | 0.54 (0.54) | Inches |
| E4 | 1.41 (1.41) | Inches |
| F4 | 0.06 (0.06) | Inches |
| G4 | 0.29 (0.34) | Inches |
| H4 | 0.12 (0.12) | Inches |
| I4 | R0.015 (R0.015) | Inches |

*Note: Values in parenthesis are for an alternative embodiment.

Figure 5:
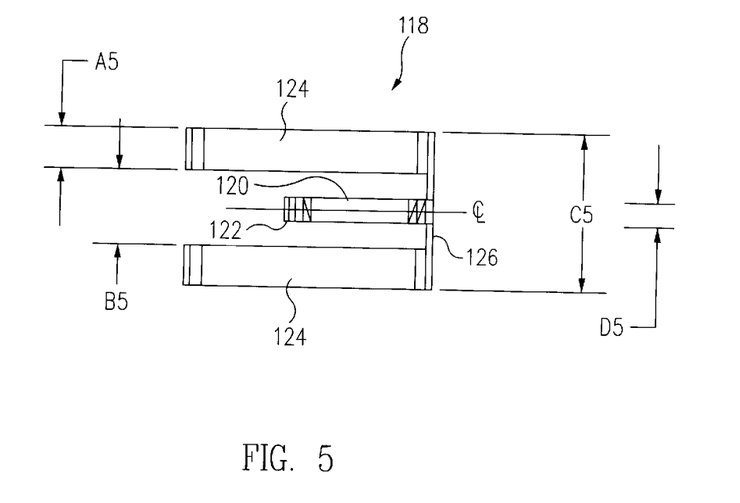
FIG. 5 is a top plan view of the retainer of FIG. 3.

FIG. 5 is a top plan view of retainer 118 of FIG. 3. As shown in FIG. 5, finger 120 is laterally located between legs 124 such that retainer 118 is symmetric about a center line $C_L$. In this manner, force exerted on finger 120 is evenly distributed to legs 124.

Illustrative specifications for the various characteristics shown in FIG. 5 are set forth below in Table 3.

TABLE 3

| Characteristic | Specification | Units |
|---|---|---|
| A5 | 2 × 0.236 | Inches |
| B5 | 0.374 | Inches |
| C5 | 0.846 | Inches |
| D5 | 0.135 | Inches |

Figure 6:
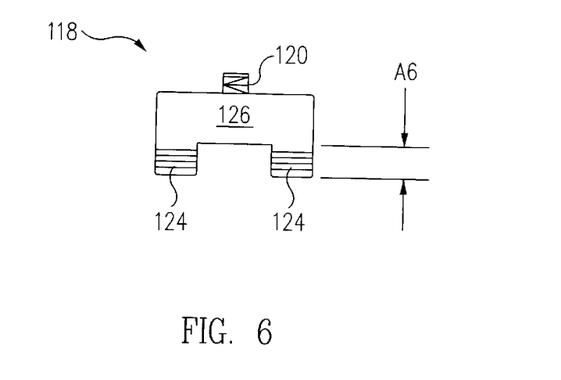
FIG. 6 is a front plan view of the retainer of FIG. 3.

FIG. 6 is a front plan view of retainer 118 of FIG. 3. An illustrative specification for the various characteristics shown in FIG. 6 is set forth below in Table 4.

TABLE 4

| Characteristic | Specification | Units |
| --- | --- | --- |
| A6 | 0.18 (0.351*) | Inches |

*Note: Value in parentheses is for an alternative embodiment.

FIG. 7 is a perspective view of heat sink 112 of FIG. 2. As shown in FIG. 7, fins 114 are parallel with one another. Each fin 114 includes a slit 136 extending from the top 114T of each fin 114 downwards in the vertical direction (along the y axis) towards base 115. Collectively, slits 136 form a trench 138 which extends along the longitudinal axis (along the z axis) perpendicular to a plane (x-y plane) defined by fins 114.

Extending parallel to a plane defined by fins 114 (along the x axis) between each fin 114 is a slot 140. Each slot 140 extends from the tops 114T of adjacent fins 114 downwards to base 115.

Figure 8:
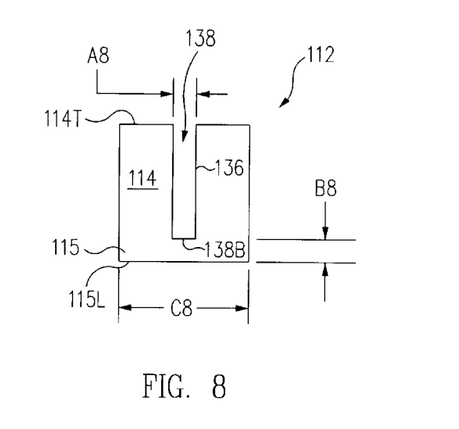
FIG. 8 is a front plan view of the heat sink of FIG. 7.

FIG. 8 is a front plan view of heat sink 112 of FIG. 7. Illustrative specifications for the various characteristics shown in FIG. 8 are set forth below in Table 5.

TABLE 5

| Characteristic | Specification | Units |
| --- | --- | --- |
| A8 | 0.158 | Inches |
| B8 | 0.15 | Inches |
| C8 | 0.846 | Inches |

Figure 9:
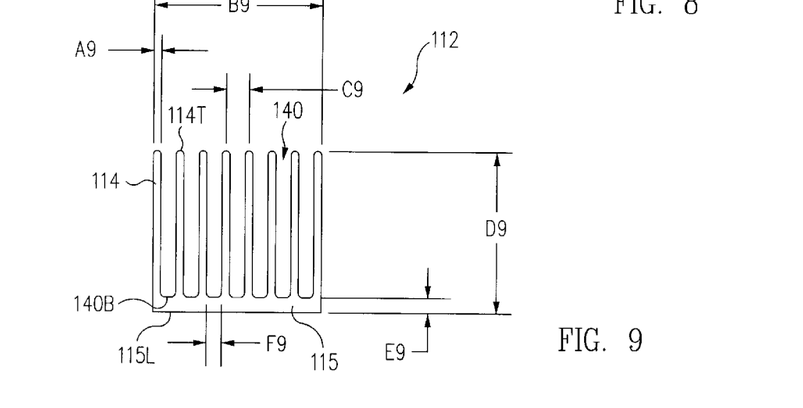
FIG. 9 is a side plan view of the heat sink of FIG. 7.

FIG. 9 is a side plan view of heat sink 112 of FIG. 7. Illustrative specifications for the various characteristics shown in FIG. 9 are set forth below in Table 6.

TABLE 6

| Characteristic | Specification | Units |
| --- | --- | --- |
| A9 | 8 × 0.042 | Inches |
| B9 | 1.260 | Inches |
| C9 | 7 × 0.174 | Inches |
| D9 | 1.0 | Inches |
| E9 | 0.100 | Inches |
| F9 | 7 × 0.118 | Inches |

Referring now to FIGS. 8 and 9 together, the distance between lower surface 115L of base 115 and the bottom 138B of trench 138 (i.e., characteristic B8 of FIG. 8) is greater than the distance between lower surface 115L of base 115 and the bottoms 140B of slots 140 (i.e., characteristic E9 of FIG. 9). For example, characteristic B8 is 0.15 inches and characteristic E9 is 0.100 inches as set forth above in Tables 5 and 6, respectively. Stated a different way, slots 140 are deeper than trench 138.

Referring again to FIG. 2, by forming slots 140 with a greater depth than, and perpendicular to, trench 138, finger tip 122 locks heat sink 112 securely in place. In particular, apex 128 of finger tip 122 extends below trench 138 (trench bottom 138B is indicated by the dashed line) and into the center slot 140C of slots 140. In this manner, side to side motion of heat sink 112 is prevented. Further, by sizing finger 120 and/or finger tip 122 to have a width (i.e., characteristic D5 of FIG. 5) slightly less than and approximately equal to the width of trench 138 (i.e., characteristic A8 of FIG. 8), motion of heat sink 112 in the direction perpendicular to the plane of the page of FIG. 2 is also prevented. As an illustration, characteristic D5 is 0.135 inches and characteristic A8 is 0.158 inches as set forth above in Tables 3 and 5, respectively.

Referring still to FIG. 2, tension in retainer 118 causes finger tip 122 to apply downward vertical force on heat sink 112. This tension is created because the distance between finger tip 122 and legs 124 is greater when retainer 118 is secured to heat sink 112 than when retainer 118 is in its relaxed state. Heat sink 112, in turn, presses downwards towards IC packages 104. More particularly, heat sink 112 presses down on thermal pad 116 which presses on IC packages 104 thus forming the thermal contact between heat sink 112 and IC packages 104.

Of importance, heat sink 112 presses down uniformly on IC packages 104. This is because finger tip 122 is located in the center slot 140C of slots 140 and accordingly presses down directly at the center of heat sink 112. If multiple fingers 120 are used, preferably fingers 120 are symmetric about a centerline of retainer 118. This helps to assure that the force distribution created by retainer 118 on heat sink 112 is substantially uniform.

The vertical downward force (e.g., first force) applied on IC packages 104 by heat sink 112 is countered by an equal vertical upward force (e.g., a second force equal and opposite the first force) applied by legs 124 of retainer 118 on circuit board 102 (via IC packages 105) directly opposite IC packages 104. Since legs 124 are symmetric with respect to finger 120, each leg 124 applies an equal upward force on IC packages 105. Accordingly, legs 124 press uniformly on IC packages 105. Thus, a heat sink assembly in accordance with the present invention avoids the application of uneven force distribution on IC packages 104, 105 and the associated damage and ultimate device failure caused by use of conventional heat sink assemblies.

As best seen in FIG. 2, legs 124 are located adjacent lower die attach area 108L of circuit board 102 directly opposite from upper die attach area 108U. Thus, the vertical upward force is transferred from legs 124 directly back to heat sink 112 through IC packages 105, circuit board 102, IC packages 104 and thermal pad 116 without imparting any bending force on circuit board 102. In this manner, a heat sink assembly in accordance with the present invention avoids circuit board warpage and the associated ultimate device failure associated with conventional heat sink assemblies.

Of further importance, retainer 118 passes around edge 102E of circuit board 102. This allows greater utilization of circuit board 102, e.g., allows more traces and/or vias to be located on or in circuit board 102, compared to having a retainer pass through circuit board 102.

Heat sink 112 is also readily attached by retainer 118. To attach heat sink 112, heat sink is positioned such that IC packages 104 and thermal pad 116 are located between heat sink 112 and circuit board 102. While holding heat sink 112 in place, retainer 118 is positioned so that finger 120 is aligned to slid into trench 138 and legs 124 are aligned to slid under and around circuit board 102 including IC packages 105. Retainer 118, typically body 126, is then pressed towards edge 102E of circuit board 102 which slides legs 124 around circuit board 102 and on IC packages 105 and also slides finger 120 into trench 138. Retainer 118 is pressed until finger tip 122 is located in central slot 140C. Angled ends 130, 132 of finger tip 122, legs 124 prevent finger tip 122, legs 124 from getting caught on heat sink 112, IC packages 105, respectively.

Heat sink 112 is also readily removed. To remove heat sink 112, retainer 118, typically body 126, is pulled so that finger 120 slides out of trench 138. Heat sink 112 is then removed.

In some applications, installation of retainer 118 by the method described above may damage the assembly. For example, sliding of legs 124 along IC packages 105 can damage IC packages 105 or cause circuit interconnection failure between IC packages 105 and circuit board 102, e.g., can cause solder ball cracking or failure. To avoid any potential damage to the assembly, finger 120 is spread apart from legs 124. Retainer 118 is then positioned such that finger tip 122 is located in central slot 140C and legs 124 are located below IC packages 105. Finger 120 is then released securing retainer 118 to heat sink 112.

While retainer 118 can be installed by hand, care must be exercised to prevent sliding finger tip 122 along heat sink 112 and legs 124 along IC packages 105. However, as set forth above, an alternative method of installation avoids the possibility of this sliding.

Figure 10:
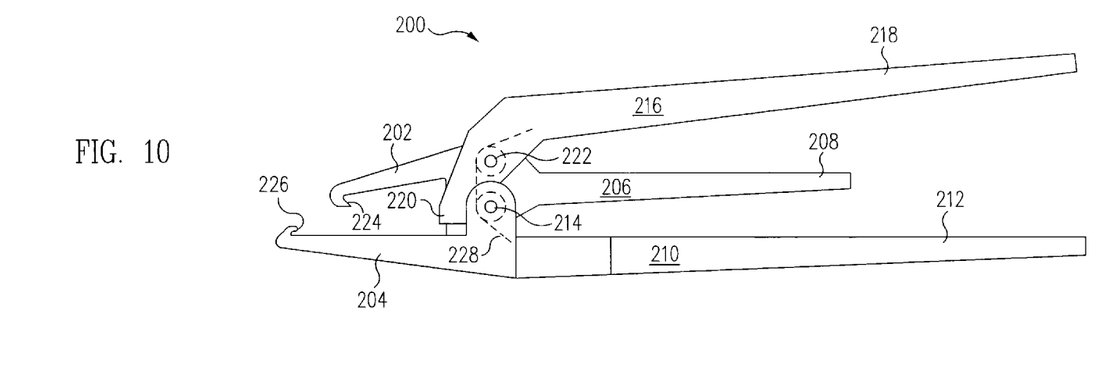
FIG. 10 is a side plan view of a clip assembly tool in accordance with the present invention.

FIG. 10 is a side plan view of a clip assembly tool 200 in accordance with the present invention. Tool 200 includes clasps 202, 204 for grasping finger 120 and legs 124, respectively, and spreading them apart from one another. In this manner, tool 200 facilitates attachment of retainer 118 to heat sink 112 without sliding of retainer 118.

Tool 200 includes an upper arm 206 which includes a handle 208 at one end and clasp 202 at the opposite end. Tool 200 further includes a lower arm 210 having a handle 212 at one end and clasp 204 at the opposite end. Upper and lower arms 206, 210 are pivotally attached to one another by a pivot 214. Thus, motion of handle 208 towards handle 212 causes clasp 202 to move away from clasp 204 and vice versa.

Tool 200 further includes a wedge arm 216. Wedge arm 216 includes a handle 218 at one end and a nose 220 at the opposite end. Wedge arm 216 is pivotally attached to upper arm 206 by a pivot 222. Thus, motion of handle 218 towards handle 208 causes nose 220 to become extended towards clasp 202 and vice versa. As discussed in more detail below, nose 220 wedges finger 120 and legs 124 of retainer 118 into catches 224, 226 of clasps 202, 204, respectively. Catches 224, 226 are pockets so that, after being wedged, finger 120 and legs 124 are securely held by catches 224, 226, respectively.

A spring 228 indicated in phantom lines wraps around pivots 214, 222 and presses against handles 212, 218. By pressing against handles 212, 218, spring 228 operates to urge handle 218 away from handle 212 keeping nose 220 retracted away from clasp 202 when tool 200 is not in use.

In accordance with the present invention, a method of using tool 200 to attach a retainer 118A to heat sink 112 is presented. FIG. 11 is a side plan view of retainer 118A being placed in clasps 202, 204 of tool 200.

To allow retainer 118A to be placed between clasps 202, 204, handle 208 of upper arm 206 is moved from its original position 208A downwards and towards handle 212 to a position 208B. This pivots upper arm 206 and wedge arm 216 about pivot 214. Accordingly, clasp 202 moves from its original position 202A upwards and away from clasp 204 to a position 202B. At position 202B, the vertical distance between clasps 202, 204, including the vertical distance between catches 224, 226, is greater than the height of retainer 118A, i.e., is greater than the distance between legs 124 and finger 120.

After clasp 202 has been moved to position 202B, retainer 118A is inserted, body 126 first, in between clasps 202, 204. Retainer 118A is inserted so that body 126 is adjacent, or is in abutting contact, with nose 220. Of importance, the lateral distance between catch 224 and nose 220 is greater than the length of finger 120. Similarly, the lateral distance between catch 226 and nose 220 is greater than the length of legs 124. Since nose 220 remains retracted due to the action of spring 228 (see FIG. 10), locating body 126 adjacent nose 220 allows ends 132 of legs 124 to clear catch 226.

After retainer 118A has been placed between clasps 202, 204, handle 208 is moved from position 208B away from handle 212 back to its original position 208A. This pivots upper arm 206 and wedge arm 216 back about pivot 214. Accordingly, clasp 202 moves from position 202B downwards and towards clasp 204 back to its original position 202A. Since nose 220 remains retracted, locating body 126 adjacent nose 220 allows catch 226 to clear end 130.

At position 202A, the vertical distance between catches 224, 226 is less than the distance between end 130 of finger tip 122 and ends 132 of legs 124.

FIG. 12 is a side plan view of retainer 118A being secured in clasps 202, 204 of tool 200. After retainer 118A is placed between clasps 202, 204, handle 218 of wedge arm 216 is moved from its original position 218A downwards towards upper arm 206 and lower arm 210. This causes wedge arm 216 to pivot about pivot 222 which causes nose 220 to swing towards clasp 202. As a result, nose 220 presses on body 126 of retainer 118A and moves retainer 118A towards catches 224, 226. This causes ends 130, 132 to be forced into and held securely by catches 224, 226, respectively. By forming catches 224, 226 as pockets corresponding in shape to ends 130, 132 of finger 120, legs 124, respectively, tool 200 can be used with a variety of different ends and retainers. For example, end 130 of FIG. 12 is at an angle away from legs 124 and catch 224 is pie shaped to accommodate end 130. Further, legs 124 include ends 132 which are straight and catch 226 is groove shaped to accommodate ends 132.

Regardless of the shape of catches 224, 226, once ends 130, 132 are securely wedged, handle 218 of wedge arm 216 is located at position 218B. At position 218B, retainer 118A prevents wedge arm 216 from further pivoting around pivot 222. Thus, at position 218B, retainer 118A prevents handle 218 from being moved closer to handle 208 of upper arm 206.

FIG. 13 is a side plan view of retainer 118A having finger 120 spread from legs 124 by tool 200. As set forth above, when handle 218 is at position 218B, retainer 118A prevents handle 218 from being moved closer to handle 208 of upper arm 206. Thus, further motion of handle 218 from position 218B downwards towards handle 212 to a position 218C produces an equal downward motion of handle 208 of upper arm 206. Thus, handle 208 of upper arm 206 is once again moved from its original position 208A (see FIG. 11) towards handle 212 to position 208B. This pivots upper arm 206, including wedge arm 216, about pivot 214. Accordingly, clasp 202 moves from its original position 202A (see FIG. 11) upwards and away from clasp 204 to position 202B. Since finger 120, legs 124 are securely fastened to catchs 224, 226, respectively, finger 120 is spread from legs 124. Thus, finger 120 moves from its original position 120A away from legs 124 to position 120B.

Referring again to FIG. 2, after spreading, the distance between finger 120 and legs 124 is greater than the characteristic D3, where characteristic D3 is the distance from the lower surface of device 100 (the lower surfaces of IC packages 105 in this embodiment) and bottom 138B of trench 138. Illustratively, characteristic D3 is 0.415 inches as set forth above in Table 1. Finger 120 is then inserted into trench 138 and legs 124 are positioned about and below circuit board 102 including IC packages 105. Retainer 118A is moved until finger tip 122 is located in central slot 140C and legs 124 are located below IC packages 105. Of importance, since the distance between finger 120 and legs 124 is greater than characteristic D3, retainer 118A is positioned without sliding finger tip 122 along heat sink 112 and without sliding legs 124 along IC packages 105. Thus, use of tool 200 in accordance with the invention avoids the possibility of damaging device 100, e.g., avoids potential damage to IC packages 105 and to the circuit interconnections between IC packages 105 and circuit board 102.

Tool 200 is then operated by reversing the above described steps to release finger 120 and secure retainer 118A to heat sink 112. Referring again to FIG. 13, handle 218 is moved from position 218C away from handle 212 to position 218B. This moves handle 208 from position 208B away from handle 212 and back to its original position 208A (see FIG. 11). This pivots upper arm 206 about pivot 214 which moves clasp 202 from position 202B downwards and towards clasp 204 to its original position 202A (see FIG. 11). As a result, finger 120 is moved from position 120B downwards and toward legs 124 until finger 120 presses on heat sink 112 (see FIG. 2). At this point, tension in retainer 118A securely holds retainer 118A in place.

Referring now to FIG. 12, handle 218 of wedge arm 216 is moved from position 218B upwards away from upper arm 206 and lower arm 210. This causes wedge arm 216 to pivot about pivot 222 which causes nose 220 to swing away from clasp 202. As a result, nose 220 releases retainer 118A and in particular, releases ends 130, 132 from catches 224, 226 respectively. It may be necessary to move tool 200 such that nose 220 contacts body 126 of retainer 118A to fully release ends 130, 132 from catches 224, 226, respectively.

Referring to FIG. 11, handle 208 of upper arm 206 is then moved from its original position 208A towards handle 212 of lower arm 210 to position 208B. This pivots upper arm 206 and wedge arm 216 about pivot 214. Accordingly, clasp 202 moves from its original position 202A upwards and away from clasp 204 to position 202B. At this point, tool 200 is free and clear of retainer 118A.

Retainer 118 is also readily removed by tool 200 by simply reversing the above described procedure.

Figures 14, 15:
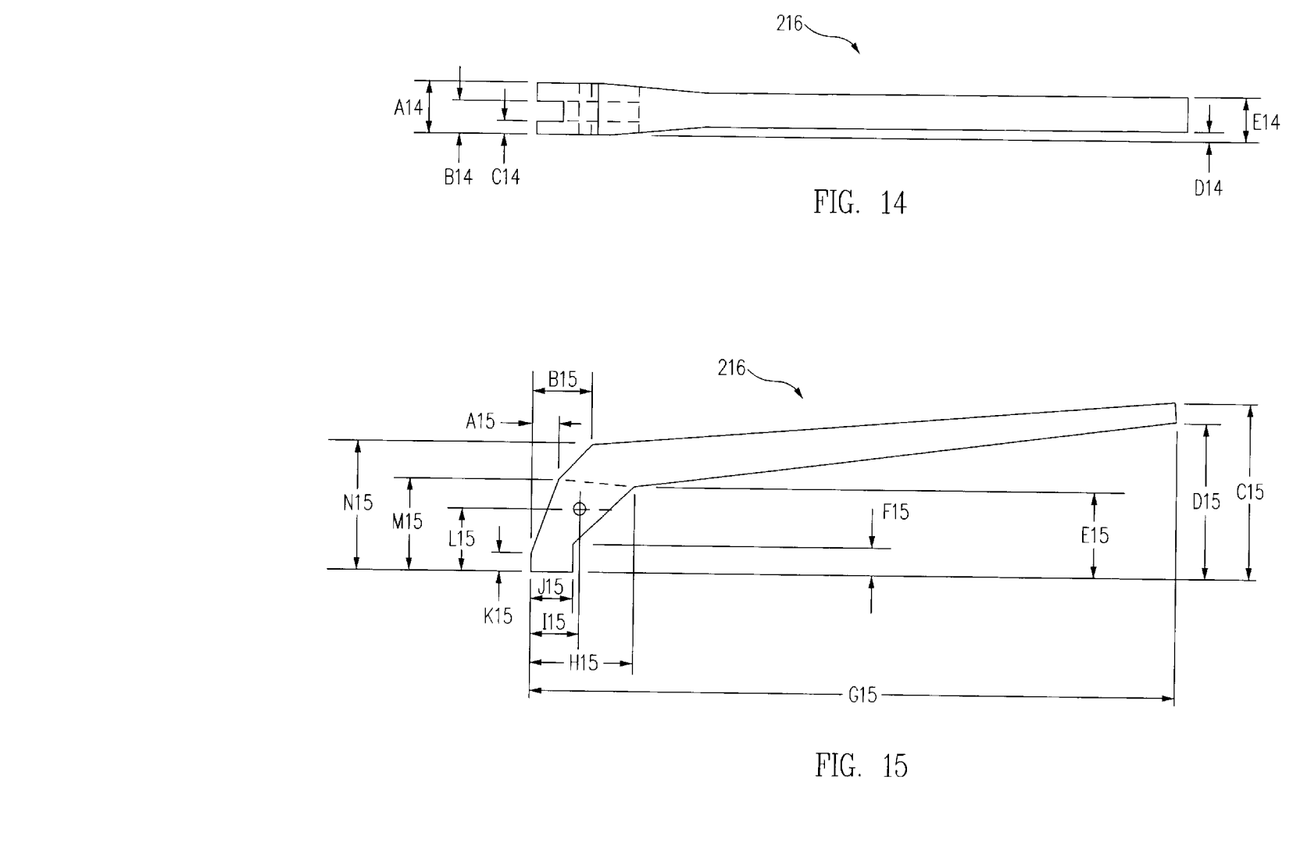
FIG. 14 is a top plan view of a wedge arm of the tool of FIG. 10.
FIG. 15 is a side plan view of the wedge arm of FIG. 14.

FIG. 14 is a top plan view of wedge arm 216 of tool 200. Illustrative specifications for the various characteristics shown in FIG. 14 are set forth below in Table 7.

TABLE 7

| Characteristic | Specification | Units |
| --- | --- | --- |
| A14 | 0.530 | Inches |
| B14 | 0.340 | Inches |
| C14 | 0.140 | Inches |
| D14 | 0.090 | Inches |
| E14 | 0.440 | Inches |

FIG. 15 is a side plan view of wedge arm 216 of tool 200. Illustrative specifications for the various characteristics shown in FIG. 15 are set forth below in Table 8.

TABLE 8

| Characteristic | Specification | Units |
| --- | --- | --- |
| A15 | 0.270 | Inches |
| B15 | 0.625 | Inches |
| C15 | 1.825 | Inches |
| D15 | 1.62 | Inches |

TABLE 8-continued

| Characteristic | Specification | Units |
| --- | --- | --- |
| E15 | 0.93 | Inches |
| F15 | 0.300 | Inches |
| G15 | 6.72 | Inches |
| H15 | 1.05 | Inches |
| I15 | 0.500 | Inches |
| J15 | 0.435 | Inches |
| K15 | 0.205 | Inches |
| L15 | 0.685 | Inches |
| M15 | 0.990 | Inches |
| N15 | 1.350 | Inches |

Figure 16:
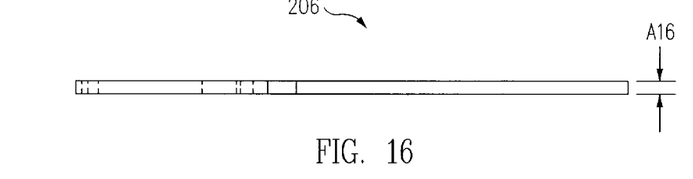
FIG. 16 is a top plan view of an upper arm of the tool of FIG. 10.

FIG. 16 is a top plan view of upper arm 206 of tool 200. An illustrative specification for the various characteristics shown in FIG. 16 is set forth below in Table 9.

TABLE 9

| Characteristic | Specification | Units |
| --- | --- | --- |
| A16 | 0.125 | Inches |

Figure 17:
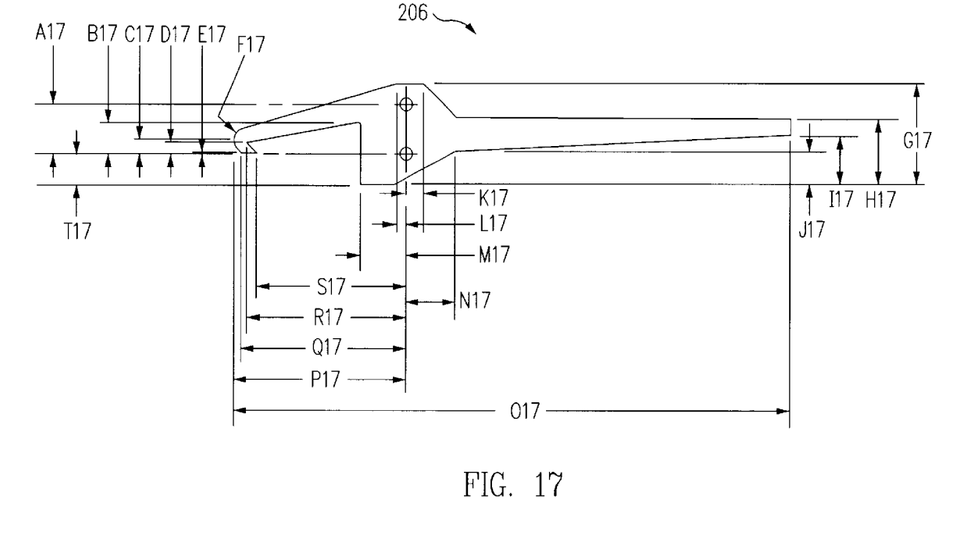
FIG. 17 is a side plan view of the upper arm of FIG. 16.

FIG. 17 is a side plan view of upper arm 206 of tool 200. Illustrative specifications for the various characteristics shown in FIG. 17 are set forth below in Table 10.

TABLE 10

| Characteristic | Specification | Units |
| --- | --- | --- |
| A17 | 0.500 | Inches |
| B17 | 0.325 | Inches |
| C17 | 0.135 | Inches |
| D17 | 0.105 | Inches |
| E17 | 0.010 | Inches |
| F17 | Rad 0.125 | Inches |
| G17 | 1.000 | Inches |
| H17 | 0.675 | Inches |
| I17 | 0.505 | Inches |
| J17 | 0.330 | Inches |
| K17 | 0.190 | Inches |
| L17 | 0.110 | Inches |
| M17 | 0.44 | Inches |
| N17 | 0.500 | Inches |
| O17 | 5.49 | Inches |
| P17 | 1.67 | Inches |
| Q17 | 1.6 | Inches |
| R17 | 1.545 | Inches |
| S17 | 1.455 | Inches |
| T17 | 0.295 | Inches |

Figure 18:
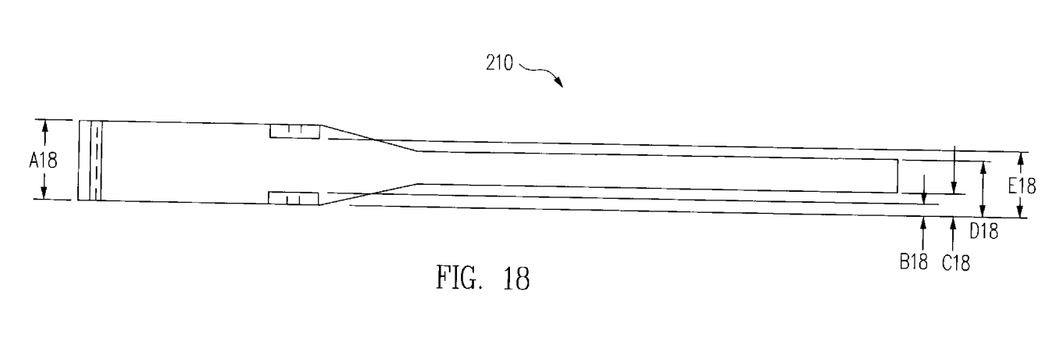
FIG. 18 is a top plan view of a lower arm of the tool of FIG. 10.

FIG. 18 is a top plan view of lower arm 210 of tool 200. Illustrative specifications for the various characteristics shown in FIG. 18 are set forth below in Table 11.

TABLE 11

| Characteristic | Specification | Units |
| --- | --- | --- |
| A18 | 0.850 | Inches |
| B18 | 0.150 | Inches |
| C18 | 0.250 | Inches |
| D18 | 0.600 | Inches |
| E18 | 0.700 | Inches |

Figure 19:
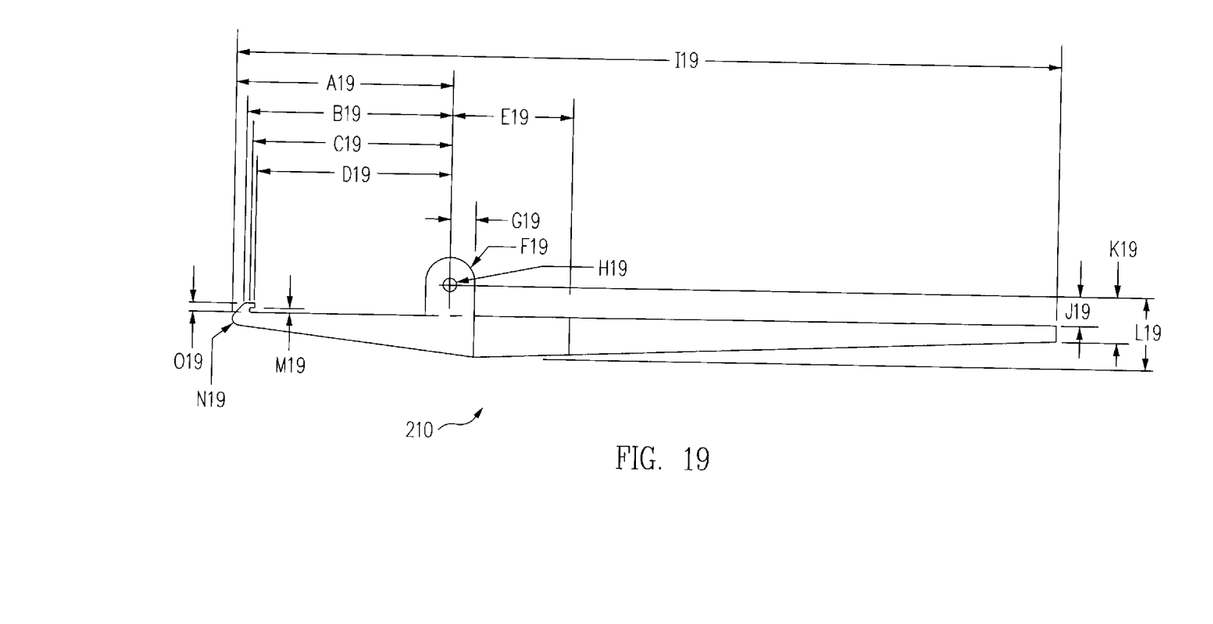
FIG. 19 is a side plan view of the lower arm of FIG. 18.

FIG. 19 is a side plan view of lower arm 210 of tool 200. Illustrative specifications for the various characteristics shown in FIG. 19 are set forth below in Table 12.

TABLE 12

| Characteristic | Specification | Units |
|---|---|---|
| A19 | 2.245 | Inches |
| B19 | 2.12 | Inches |
| C19 | 2.055 | Inches |
| D19 | 2.005 | Inches |
| E19 | 1.26 | Inches |
| F19 | Rad 0.250 | Inches |
| G19 | 0.250 | Inches |
| H19 | Dia 0.125 | Inches |
| I19 | 8.575 | Inches |
| J19 | 0.32 | Inches |
| K19 | 0.52 | Inches |
| L19 | 0.765 | Inches |
| M19 | 0.045 | Inches |
| N19 | Rad 0.0625 | Inches |
| O19 | 0.095 | Inches |

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

I claim:

1. A structure comprising:
   a retainer comprising:
      a body having a first body edge and a second body edge, said second body edge being opposite and removed from said first body edge;
      a finger extending from said body along said first body edge; and
      at least one leg extending from said body along said second body edge;
   a substrate;
   a heat sink; and
   a first package comprising an electronic device, said first package being located between said substrate and said heat sink, wherein said retainer holds said heat sink in place.

2. The structure of claim 1 wherein said finger presses said heat sink towards said first package.

3. The structure of claim 2 wherein said heat sink presses down uniformly on said first package.

4. The structure of claim 1 wherein said finger applies a first force on said heat sink, said first force being countered by a second force applied by said at least one leg on said substrate directly opposite said first package.

5. The structure of claim 4 wherein said second force is applied without imparting any bending force on said substrate.

6. The structure of claim 4 wherein said first package is attached to a first surface of said substrate, said structure further comprising a second package comprising an electronic device, said second package attached to a second surface of said substrate directly opposite said first package.

7. The structure of claim 6 wherein said at least one leg applies said second force on said second package and thereby on said substrate.

8. The structure of claim 1 wherein said body is adjacent an edge of said substrate.

9. A heat sink retainer comprising:
   a body having a first body edge and a second body edge, said second body edge being opposite and removed from said first body edge;
   a finger extending from said body along said first body edge; and
   at least one leg extending from said body along said second body edge, wherein said at least one leg comprises a first leg and a second leg, said finger being laterally located between said first leg and said second leg.

10. The heat sink retainer of claim 9 wherein force is exerted on said finger, said force being evenly distributed to said first leg and said second leg.

11. The heat sink retainer of claim 9 wherein said heat sink retainer is made of a flexible resilient material.

12. A heat sink assembly comprising:
   a base; and
   fins extending from said base, wherein slits in said fins define a trench and wherein slots are located between said fins, said slots having a greater depth than said trench, wherein a heat sink comprises said base, said fins, said trench and said slots, said heat sink assembly further comprising a retainer having a finger tip with a width less than a width of said trench.

13. The heat sink assembly of claim 12 wherein said slots are perpendicular to said trench.

14. The heat sink assembly of claim 12 wherein an apex of said finger tip extends below said trench and into a first slot of said slots.

15. The heat sink assembly of claim 14 wherein said first slot is the center slot of said slots.

* * * * *